United States Patent [19]
Lin et al.

[11] Patent Number: 6,153,456
[45] Date of Patent: Nov. 28, 2000

[54] METHOD OF SELECTIVELY APPLYING DOPANTS TO AN INTEGRATED CIRCUIT SEMICONDUCTOR DEVICE WITHOUT USING A MASK

[75] Inventors: Xi-Wei Lin; Emmanual de Muizon, both of Fremont, Calif.

[73] Assignee: VLSI Technology, Inc., San Jose, Calif.

[21] Appl. No.: 09/007,117

[22] Filed: Jan. 14, 1998

[51] Int. Cl.$^7$ ............................................... H01L 21/8238
[52] U.S. Cl. ............................................ 438/232; 438/585
[58] Field of Search ................................... 438/232, 231, 438/301, 303, 305, 585

[56] References Cited

U.S. PATENT DOCUMENTS

| | | | |
|---|---|---|---|
| 4,301,588 | 11/1981 | Horng et al. | 29/276 |
| 4,764,478 | 8/1988 | Hiruta | 437/29 |
| 4,914,046 | 4/1990 | Tobin et al. | 437/24 |
| 4,971,922 | 11/1990 | Watabe et al. | 437/44 |
| 5,168,072 | 12/1992 | Moslehi | 437/41 |
| 5,225,357 | 7/1993 | Ho | 432/30 |
| 5,340,756 | 8/1994 | Nagayasu | 437/34 |
| 5,352,631 | 10/1994 | Sitaram | 438/303 |
| 5,393,676 | 2/1995 | Anjum et al. | 437/24 |
| 5,395,780 | 3/1995 | Hwang | 438/515 |
| 5,447,875 | 9/1995 | Moslehi | 437/41 |
| 5,512,498 | 4/1996 | Okamoto | 437/35 |
| 5,545,579 | 8/1996 | Liang et al. | 437/44 |
| 5,567,638 | 10/1996 | Lin et al. | 437/46 |
| 5,614,428 | 3/1997 | Kapoor | 437/41 |
| 5,683,920 | 11/1997 | Lee | 438/231 |
| 5,683,941 | 11/1997 | Kao et al. | |
| 5,710,450 | 1/1998 | Chau et al. | 438/303 |
| 5,731,239 | 3/1998 | Wong et al. | 438/586 |
| 5,739,059 | 4/1998 | Chen et al. | 438/385 |
| 5,840,609 | 11/1998 | Hyeon et al. | 438/303 |
| 5,856,225 | 1/1999 | Lee et al. | 438/299 |
| 5,891,771 | 4/1999 | Wu et al. | 438/301 |

OTHER PUBLICATIONS

Wolf et al., Silicon Processing for the VLSI Era V.1&2, Lattice Press: CA, p154–155 V2,pp 557 V.1, Dec. 1986.
W. S. Ruska, Microelectronic Processing, McGraw–Hill inc.: New York, pp. 387 and 81, Dec. 1987.

*Primary Examiner*—Carl Whitehead, Jr.
*Assistant Examiner*—Jeff Vockrodt
*Attorney, Agent, or Firm*—Woodard, Emhardt, Naughton Moriarty & McNett

[57] ABSTRACT

An integrated circuit is disclosed that includes a semiconductor substrate, an oxide layer on the substrate, and a polysilicon layer on the oxide layer. The polysilicon layer extends away from the substrate and is doped with elemental boron to increase electrical conductivity thereof. Boron difluoride atoms are implanted in the substrate to define corresponding source and drain regions. Initially, the boron difluoride ions also penetrate a portion of the polysilicon layer. At least a portion of the polysilicon layer is removed to substantially reduce the fluorine-induced migration of boron through the oxide layer to the substrate.

34 Claims, 3 Drawing Sheets

METHOD OF SELECTIVELY APPLYING DOPANTS TO AN INTEGRATED CIRCUIT SEMICONDUCTOR DEVICE WITHOUT USING A MASK

BACKGROUND OF THE INVENTION

The present invention relates to doping of semiconductor integrated circuits, and more particularly, but not exclusively, relates to a technique for maskless doping of an integrated circuit semiconductor substrate with a different form of dopant than an electrode structure projecting from the substrate.

The advance of integrated circuit (IC) technology toward faster, higher density integrated devices frequently focuses on decreasing device feature size. In the case of integrated Field Effect Transistors (FETs) such as Insulated Gate FETs (IGFETs), device shrinkage often favors shallow source and drain junctions. For p-type substrate source and drain regions, boron atoms are a common acceptor dopant. Unfortunately, the implantation of elemental boron ($B11^+$) ions is generally unsuitable for the formation of shallow source and drain junctions.

In one attempt to solve this problem, boron difluoride ($BF_2^+$) ions are implanted into the substrate to deliver the boron atom dopant. The relative higher atomic mass of $BF_2^+$ ions results in a shallower junction penetration compared to $B11^+$ ions implanted at the same implantation energy level. U.S. Pat. Nos. 5,393,676 to Anjum et al. and 5,225,357 to Ho are cited at representative examples of this approach.

One difficulty with this approach is that fluorine (F) atoms in a polysilicon gate structure enhance boron (B) atom migration through the gate oxide to the substrate below, which tends to cause unwanted threshold voltage shifts in the corresponding FET device. This fluorine-induced migration problem typically results when atoms of the $BF_2$ implanted in the gate polysilicon begin to diffuse due to subsequent thermal processing. To avoid this difficulty, the gate structure may be selectively masked to prevent penetration by the $BF_2^+$ ion implant species; however, this additional masking operation is generally undesirable and may prove difficult to reliably perform for gate structures having features scaled in the deep submicron regime. Thus, there is a need for a method to implant substrate source and drain regions with $BF_2^+$ ions that prevents fluorine-induced migration of boron atoms through the gate oxide.

The present invention meets this need and provides other significant advantages and benefits.

SUMMARY OF THE INVENTION

The present invention relates to doping of integrated circuit devices. Various aspects of the invention are novel, nonobvious and provide various advantages. While the actual nature of the invention covered herein can only be determined with reference to the claims appended hereto, certain aspects which are characteristic of the preferred embodiment are described briefly as follows.

One form of the present invention includes defining a transistor with a gate structure projecting from a substrate. The gate structure is doped with a first dopant species. Corresponding source and drain regions of the substrate are doped with a second dopant species. The second dopant species also penetrates the gate structure, but is removed by etching away the penetrated part of the gate structure.

Another form of the present invention includes forming an oxide layer on a semiconductor substrate and establishing a polysilicon layer on the oxide layer. The polysilicon layer is doped with a first dopant to enhance electrical conductivity. A transistor is defined having a source region, a drain region, and a gate structure. The gate structure is positioned between the source region and the drain region along the substrate. The gate structure is formed from a portion of the polysilicon layer and a pad of the oxide layer. A second dopant is implanted in the source region, the drain region, and an upper part of the polysilicon portion of the gate structure. The upper part is positioned above the drain region and source region, and the second dopant is provided in the form of a different dopant species than the first dopant. A coating is deposited on the source region, the drain region, and the gate structure. The upper part of the gate structure is etched away to substantially remove the second dopant therefrom and the transistor is heated to activate the second dopant. In one embodiment of this form of the present invention, the first dopant is provided by implanting elemental boron ions and the second dopant is provided by implanting boron difluoride ions.

In another form of the present invention, an integrated circuit device is formed along the semiconductor substrate that includes a gate structure having an oxide pad contacting the substrate and a polysilicon layer contacting the oxide pad. The polysilicon layer extends away from the substrate and is doped with a first dopant to increase electrical conductivity of the polysilicon layer. The substrate is doped with a second dopant to define a source region and drain region corresponding to the gate structure. The second dopant penetrates the polysilicon layer to form a twice-doped part thereof. The first dopant and the second dopant are of the same conductivity type, and the second dopant is provided in the form of boron difluoride ions. At least a portion of the twice-doped part is removed from the gate structure to substantially suppress fluorine-induced boron diffusion through the gate oxide pad. The source region and the drain region are coated to remain generally unaltered by this removal.

In still another form of the present invention, an oxide layer is formed on a semiconductor substrate and a polysilicon layer is established on the oxide layer. The polysilicon layer is doped with the first dopant. An electronic device is defined along the substrate having a gate structure formed from the polysilicon layer and the oxide layer. The gate structure projects away from the substrate. The substrate is doped with the second dopant to define a source region and a drain region corresponding to the gate structure. The second dopant penetrates a part of the silicon layer of the gate structure. The first and second dopants are of the same conductivity type and the second dopant is introduced in a different molecular form than the first dopant. At least a portion of the part of the polysilicon layer of the gate structure penetrated by the second dopant is selectively removed.

Yet another form of the present invention comprises: (a) providing an integrated circuit that includes a semiconductor substrate, an oxide layer on the substrate, and a polysilicon layer on the oxide layer with the polysilicon layer extending away from the substrate and being doped with elemental boron to increase electrical conductivity, (b) implanting boron difluorlde ions in the substrate and a part of the polysilicon layer, and (c) removing at least a portion of the polysilicon layer implanted with the boron difluoride ions to substantially reduce the presence of fluorine in the polysilicon layer.

An additional form of the present invention includes: (a) forming a first layer on a semiconductor substrate, (b)

establishing a second layer on the first layer, (c) doping the second layer with a first dopant species, (d) implanting a second dopant species in the substrate and an upper region of the second layer to form a twice-doped part of the second layer, and (e) removing at least a substantial portion of the twice-doped part of the second layer.

Accordingly, one object of the present invention is to provide a method of doping different levels of an integrated circuit device with different forms of dopant without using a mask.

It is another object of the present invention to dope substrate source and drain regions of an integrated circuit device differently than a corresponding insulated gate structure.

It is still another object of the present invention, to dope a polysilicon layer on a gate oxide with boron ions and implant boron difluoride ions in a top part of the polysilicon layer and corresponding substrate source/drain regions; and then remove the part of the polysilicon layer penetrated by the boron difluoride ions to prevent fluorine-induced boron migration through the gate oxide pad.

Further objections, advantages, features, forms, and aspects of the present invention shall become apparent from the drawings and detailed description which follows.

DETAILED DESCRIPTION OF THE PREFERRED EMBODIMENT

Figure 1:
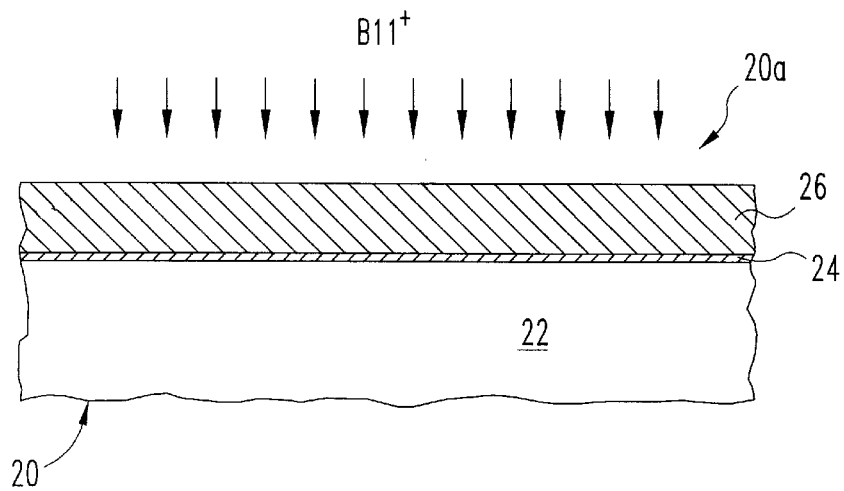
FIGS. 1–6 correspond to selected partial cross-sectional views of an integrated circuit workpiece at progressive stages of a semiconductor doping process of one embodiment of the present invention. It should be understood that like reference numerals represent like features and that selected features may not be drawn to scale to enhance clarity.

For the purposes of promoting an understanding of the principles of the invention, reference will now be made to the embodiment illustrated in the drawings and specific language will be used to describe the same. It will nevertheless be understood that no limitation of the scope of the invention is thereby intended. Any alterations and further modifications in the described techniques, processes, and devices; and any further applications of the principles of the invention as described herein are contemplated as would normally occur to one skilled in the art to which the invention relates.

FIGS. 1–6 illustrate integrated circuit workpiece 20 during selected stages 20a–20f of a semiconductor doping process of one embodiment of the present invention. As depicted in stage 20a of FIG. 1, workpiece 20 includes semiconductor substrate 22, which generally extends along a plane perpendicular to the view plane of FIG. 1. Also shown is height axis H which is generally perpendicular to this plane and parallel to the view plane of FIG. 1. Substrate 22 is preferably provided as a single-crystal silicon wafer.

Workpiece 20 also includes insulating layer 24 formed on substrate 22. Layer 24 is comprised of a dielectric material, preferably of the type suitable for use in forming the electrically insulating member of an insulated gate structure. In the preferred embodiment having a single-crystal silicon form of substrate 22, it is also preferred that layer 24 be formed of silicon dioxide. Semiconductor layer 26 of workpiece 20 is deposited on layer 24. Layer 26 is formed by depositing amorphorous silicon on layer 24, which is subsequently treated to become polycrystalline in form. This polycrystalline form alternatively may be designated as polysilicon herein. Layer 26 is doped with elemental boron (B11) using a conventional implantation technique as schematically depicted by the downwardly directed arrows with the B11$^+$ label. Boron atoms are added to enhance conductivity of semiconductor layer 26.

After implantation of boron atoms during stage 20a, integrated circuit workpiece 20 is subjected to subsequent processing. This subsequent processing exposes workpiece 20 to thermal cycling, and may include an anneal process for forming a Lightly Doped Drain (LDD) region. As a result of these thermal cycles, boron atoms diffuse throughout layer 26 and down to layer 24. A generally uniformly doped composition of layer 26 results.

Figure 2:
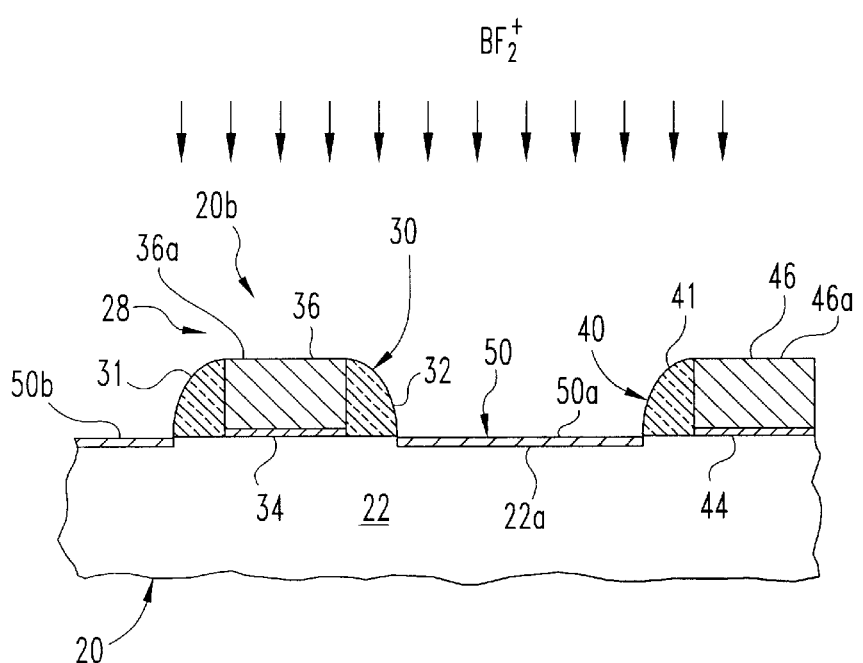

FIG. 2 depicts processing stage 20b of workpiece 20. Between stages 20a and 20b workpiece 20 is processed to define insulated gate structures 30 and 40 and define protective oxide coating 50 along generally planar surface 22a of substrate 22. Preferably, insulated gate structures 30 and 40 are formed using conventional photolithographic processing techniques. Insulated gate structure 30 includes dielectric spacers 31 and 32. Insulated gate structure 40 is partially shown with dielectric spacer 41 (a companion spacer is envisioned, but is not shown). Preferably, spacers 31, 32, and 41 are comprised of silicon dioxide or silicon nitride and are formed using techniques known to those skilled in the art. In addition, insulated gate structure 30 includes insulating gate pad 34 formed from layer 24, and insulated gate structure 40 includes insulating gate pad 44 formed from layer 24. For the preferred embodiment having layer 24 formed from silicon dioxide, it is preferred that pads 34 and 44 include an oxide thickness of less than about 100 angstroms along axis H. In a more preferred embodiment, pads 34 and 44 have a thickness along axis H of less than about 50 angstroms.

Insulated gate structures 30 and 40 also include conductive gate members 36 and 46, respectively, formed from layer 26. Members 36 and 46 have generally planar top surfaces 36a and 46a, respectively. Surfaces 36a and 46a are positioned above surface 22a relative to axis H. Insulated gate structures 30 and 40 are spaced apart from each other along the plane of substrate 22, such that insulated gate structures 30 and 40 project upwards, away from surface 22a of substrate 22 along axis H. Preferably, portions 36 and 46 have a thickness along axis H within a range of about 2000 to 3000 angstroms.

Surface 22a of substrate 22 adjacent insulated gate structures 30 and 40 is covered with a protective oxide coating 50 shown with portions 52 and 56. Members 36 and 46 may also include a similar thin, protective oxide coating (not shown).

The downwardly directed arrows in FIG. 2 bearing the BF$_2^+$ label signify implantation of positively charged boron difluoride (BF$_2^+$) ions during stage 20b. The BF$_2^+$ implant species penetrates through coating 50 and surface 22a of substrate 22, and also penetrates through surfaces 36a and 46a of corresponding insulated gate structures 30 and 40, as well as any protective coating thereon.

Figure 3:
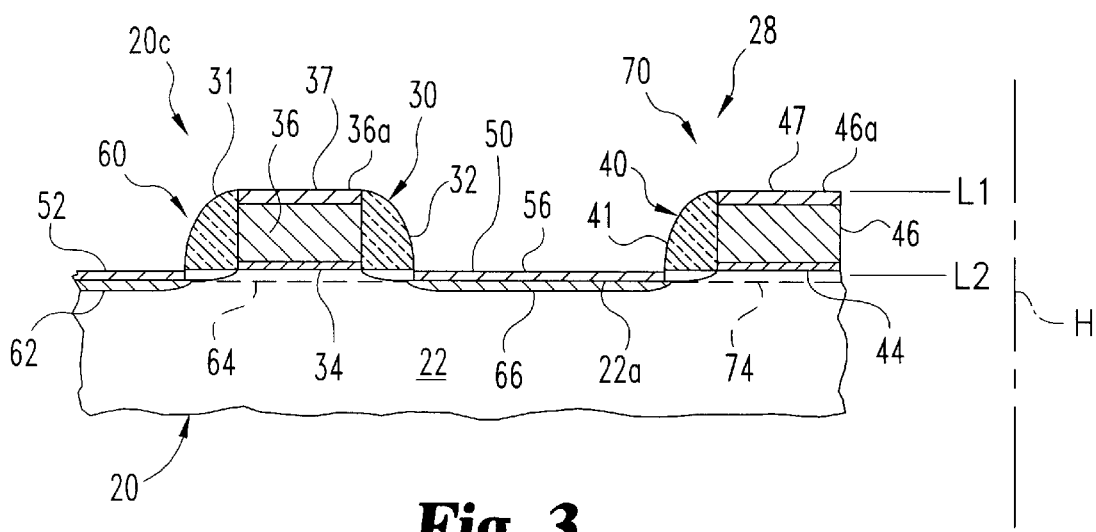

FIG. 3 depicts stage 20c after BF$_2^+$ implantation. In stage 20c, workpiece 20 defines integrated circuit devices 28 including transistor 60 and transistor 70. Transistor 60 includes insulated gate structure 30, substrate source region 62, channel 64, and common substrate drain region 66. Source region 62 and drain region 66 were formed by implanting the BF$_2^+$ species into substrate 22 through coating 50 and surface 22a to provide relatively shallow source/ drain junctions. Preferably, source region 62 and drain region 66 are less than about 500 angstroms in depth. Transistor 70 is partially depicted in FIG. 3, having a source (not shown), channel 74, and sharing common substrate drain region 66 with transistor 60. Notably, transistors 60 and 70 were not masked during the $BF_2^+$ implantation in stage 20b. As a result, twice-doped upper parts 37 and 47 corresponding to gate members 36 and 46 are formed due to penetration by $BF_2^+$ ions through respective surfaces 36a and 46a. Preferably, the thickness of parts 37, 47 along axis H is less than about 500 angstroms. It is also preferred that the critical dimension of transistors 60, 70, be less than about 0.5 micron. It is more preferred that this critical dimension be less than about 0.25 micron. It is most preferred that the critical dimension be less than about 0.20 micron.

Notably, the implanted $BF_2^+$ ions penetrate workpiece 20 at several levels along axis H. Two of these levels are diagrammatically designated as level L1 and level L2 in FIG. 3. Insulated gate structures 30 and 40 generally terminate at level L1, and the $BF_2^+$ ions correspondingly penetrate through surfaces 36a and 46a of insulated gate structures 30 and 40 at level L1. Substrate 22 generally terminates at level L2, and the $BF_2^+$ ions correspondingly penetrate Level L2 through surface 22a in source region 62 and drain region 66. Level L1 is above level L2 along axis H which facilitates the selective removal of parts 37 and 47 as more fully described hereinafter.

Figure 4:
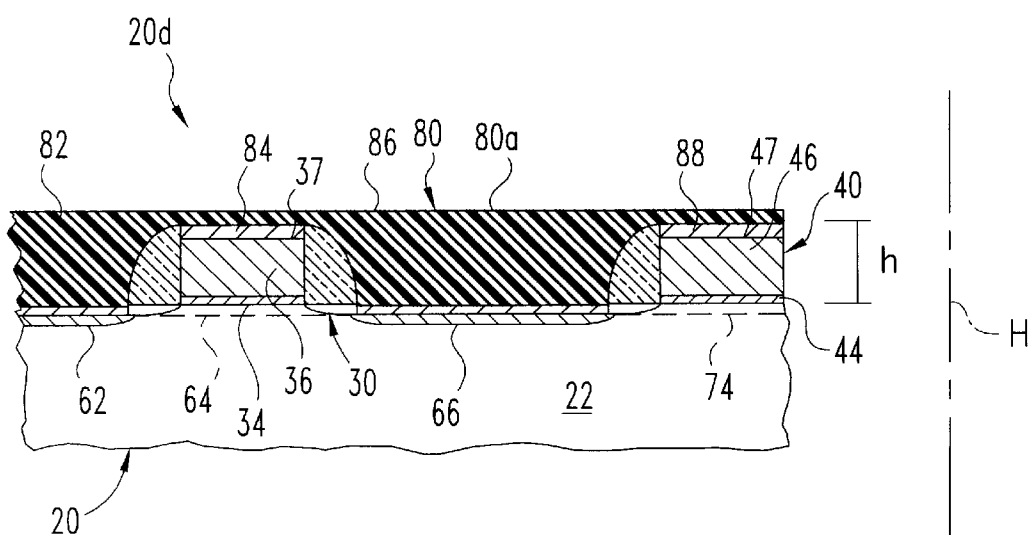

FIG. 4 depicts stage 20d. In stage 20d, workpiece 20, is coated with protective layer 80. Layer 80 is preferably a spun-on photoresist material, which provides a generally flat surface 80a. Coating 80 includes portion 82 over source region 62, portion 84 over insulated gate structure 30, portion 86 over drain region 66, and portion 88 over insulated gate structure 40. Portions 82 and 86 are notably thicker than portions 84 and 88 along axis H.

Figure 5:
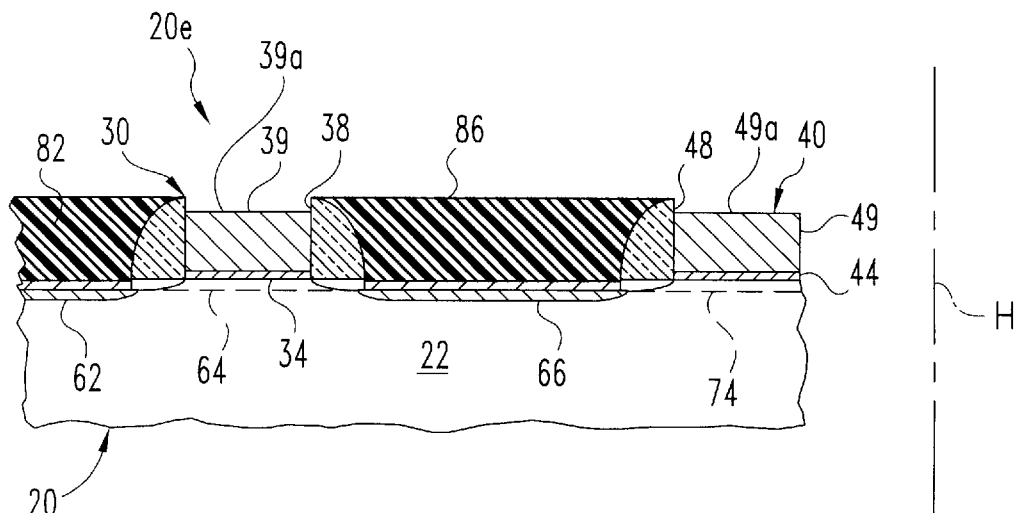

In FIG. 5, stage 20e depicts workpiece 20 after etching away an upper part of coating 80. This etching process also removes parts 37 and 47 of insulated gate structures 30 and 40, respectively, including any protective oxide coating thereon. As a result, recesses 38 and 48 are correspondingly formed in insulated gate structures 30 and 40. Gate electrode portions 39 and 49 remain from the original conductive gate members 36 and 46, respectively. Portions 39 and 49 define upper surfaces 39a and 49a which are lower than surfaces 36a and 46a, respectively, but are still above surface 22a along axis H. The removal of twice-doped parts 37, 47, and the overlying portions 84, 88 of coating 80 may be performed by a conventional etching process. In one such process, the etch chemistry includes: (a) $CF_4$ to remove layers 84, 88 of coating 80, and (b) $Cl_2$ and HBr to remove twice-doped parts 37, 47.

Notably, while the thickness of portions 82 and 86 may be reduced, the relatively thicker dimensions of these portions protect source region 62 and drain region 66, during etching. As a result, the parts 37 and 47 bearing the fluorine (F) atoms are removed before subsequent thermal processing of workpiece 20 promotes migration of boron (B) atoms through corresponding pads 34 and 44. Moreover, the protection afforded source region 62 and drain region 66 by coating portions 82 and 86 maintains the integrity of the source and drain junctions formed by $BF_2^+$ implantation. Thus, for this embodiment, a gate selective mask is not required to prevent fluorine-induced boron migration through the gate pad.

In alternative embodiments, different etching or removal processes may be employed as would occur to one skilled in the art to accomplish the selective removal of overlying portions 84 and 88 of coating 80; parts 37, 47; and any protective coating thereon. These alternatives may include the sequential application of multiple etch chemistries or other removal techniques either alone or in combination.

Figure 6:
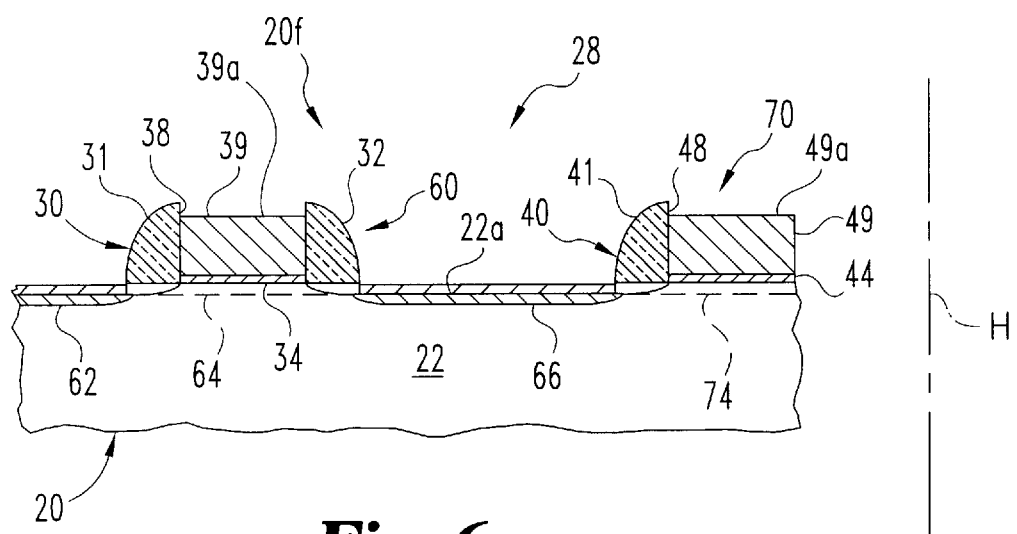

FIG. 6 depicts stage 20f in which the remaining portions of coating 80 have been stripped or removed in a conventional manner. At stage 20f, workpiece 20 is subsequently processed, including thermal activation of the implanted dopant. In one embodiment, thermal activation of $BF_2^+$ implanted in a single-crystal silicon substrate may be accomplished by heating workpiece 20 to a temperature of about 1000° celsius for about 30 seconds. Upon activation, the desired operational characteristics of transistors 60, 70 are further developed.

Notably, recesses 38, 48 also facilitate the self-aligned exposure of electrodes 39, 49 for subsequent processing. This self-aligned feature may be used to fill recesses 38, 48 with a conductive or insulative material. For example, a metal or metal alloy may be introduced into recesses 39 and 49 to further enhance electrical conductivity and facilitate electrical interconnection to other devices. Also, silicidation of source region 62, drain region 66, and gate electrodes 39, 49 may be preformed to further enhance conductivity. Notably, the removal of parts 37 and 47 in accordance with the present invention reduces doped surface concentrations. As a result, dopant-induced retardation of Titanium (Ti) silicidation is minimized, thus improving gate silicide formation. Similarly, various conventional processes as would occur to those skilled in the art may be alternatively or additionally performed.

It should be appreciated that integrated circuit workpiece 20 illustrates only a few semiconductor devices and related features to enhance clarity; however, it is preferred that a large number of semiconductor devices be spaced along substrate 22 for simultaneous processing in accordance with the present invention (not shown). In one preferred embodiment, substrate 22 is provided by a semiconductor wafer which defines a number of integrated circuit dies, and at least 100,000 semiconductor devices are defined per die. In a more preferred embodiment, at least 1,000,000 devices per semiconductor die are defined. In a most preferred embodiment, at least 10,000,000 semiconductor devices per die are defined. Also, it should be understood that the depicted arrangement of devices, structures, components, and features presented in FIGS. 1–6 are intended to be illustrative only—the present invention contemplating different arrangements of devices and different component types as would occur those skilled in the art.

For example, the selected dopants provide p-type source/ drain regions which may be suitable for a pMOS device (substrate 22 being doped to be of n-type material). Alternatively, only selected device structures may be doped in this fashion as may occur in a Complimentary Metal Oxide Semiconductor (CMOS) arrangement. This CMOS embodiment may include masking entire transistor regions to prevent doping of one transistor type by the undesired conductivity type of dopant; however, masking of the relatively smaller transistor gates generally need not be performed.

As used herein, nMOS, pMOS, MOSFET, and CMOS, refer broadly to any type of Insulated Gate FET (IGFET) device that has a conductor-insulator-semiconductor structural arrangement, whether or not the conductor includes metal or a metallic alloy. For example, these terms include, but are not limited to, devices where the conductor component is provided by doped polysilicon, a silicided polysilicon, or an elemental metal.

Besides a single-crystal silicon material, substrate 22 may be formed from other integrated circuit substrate materials as would occur to those skilled in the art. In addition, while it is preferred that layer 24 be composed of silicon dioxide for the silicon substrate arrangement, other materials suitable for a silicon substrate may be utilized. Also, for different substrate materials, a corresponding layer 24 material may be used as would occur to those skilled in the art. Likewise, while a polycrystalline silicon layer 26 is preferred, other suitable gate materials may be adapted for use with the present invention.

Thus, one alternative embodiment of the present invention includes: (a) providing an integrated circuit device having a first region terminating at a first level and a substrate projecting from the first level to terminate at a second level above the first level, (b) implanting the integrated circuit device with a dopant, the dopant penetrating the integrated circuit device at the first level and the second level, (c) covering the first region with a coating, and (d) removing at least a part of the structure penetrated by the dopant, the first region remaining coated during the removal.

As used herein, the term "silicon dioxide" and "oxide" refer broadly to a material containing silicon and oxygen that may include stoichiometric variations and impurities that do not substantially interfere with desired functional attributes of the material. Furthermore, as used herein, the terms "silicon nitride" and "nitride" refer broadly to a material containing silicon and nitrogen that may include stoichiometric variations and impurities that do not substantially interfere with desired functional attributes of the material.

It is also contemplated that the components, stages, techniques, and processes of the present invention could be altered, rearranged, substituted, deleted, duplicated, or combined as would occur to those skilled in the art without departing from the spirit of the present invention.

All publications, patents, and patent applications cited in this specification are herein incorporated by reference as if each individual publication, patent, or patent application were specifically and individually indicated to be incorporated by reference and set forth in its entirety herein.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A method, comprising:

(a) forming an oxide layer on a semiconductor substrate;

(b) establishing a polysilicon layer on the oxide layer, the polysilicon layer being doped with a first dopant to enhance electrical conductivity;

(c) defining a transistor having a source region, a drain region, and a gate structure, the gate structure being positioned between the source region and drain region along the substrate, the gate structure being formed from a portion of the polysilicon layer and a pad of the oxide layer;

(d) implanting a second dopant in the source region, the drain region, and an upper part of the polysilicon portion of the gate structure, the upper part being positioned above the drain region and source region, the second dopant being provided in the form of a different dopant species than the first dopant;

(e) depositing a coating on the source region, the drain region, and the gate structure;

(f) etching away the upper part of the gate structure to substantially remove the second dopant therefrom; and (g) heating the transistor to activate the second dopant.

2. The method of claim 1, wherein said etching away includes removing a top part of the coating over the gate structure without exposing the drain region and the source region.

3. The method of claim 1, wherein the coating is a photoresist layer deposited to define a generally planar surface and said etching away includes removing the photoresist layer over the gate structure.

4. The method of claim 1, wherein the first dopant includes elemental boron ions, and said establishing includes implanting the boron ions in the polysilicon layer.

5. The method of claim 1, wherein the first dopant and second dopant are of the same conductivity type.

6. The method of claim 5, wherein the second dopant includes boron atoms implanted in the form of boron difluoride ions.

7. The method of claim 6, wherein the first dopant includes boron atoms.

8. The method of claim 6, wherein the transistor has a critical dimension of less than about 0.5 micron.

9. The method of claim 1, wherein said defining includes masking the substrate and said etching away is self-aligned.

10. A method, comprising:

(a) forming an integrated circuit device along a semiconductor substrate, the device including a gate structure having an oxide pad contacting the substrate and a polysilicon layer contacting the oxide pad, the polysilicon layer extending away from the substrate and being doped with a first dopant to increase electrical conductivity of the polysilicon layer;

(b) doping the substrate with a second dopant to define a source region and a drain region corresponding to the gate structure, the second dopant penetrating the polysilicon layer to form a twice-doped part thereof, the first dopant and the second dopant being of the same conductivity type, and the second dopant being provided during said doping in the form of boron difluoride ions; and (c) removing at least a portion of the twice-doped part from the gate structure to substantially suppress fluorine-induced boron diffusion through the oxide pad, the source region and the drain region being coated to remain generally unaltered by said removing.

11. The method of claim 10, wherein the oxide pad has a thickness less than about 50 angstroms.

12. The method of claim 10, wherein the polysilicon layer has a thickness in a range of about 2000 to 3000 angstroms prior to said removing.

13. The method of claim 10, wherein the twice-doped part has a thickness of less than about 500 angstroms.

14. The method of claim 10, wherein the twice-doped part is positioned generally opposite the oxide pad along the gate structure and has a thickness of less than about 500 angstroms after said doping, and the polysilicon layer has a thickness of less than about 2500 angstroms after removal of the twice-doped part.

15. The method of claim 10, wherein said removing includes etching away the twice-doped part.

16. The method of claim 15, wherein said removing includes etching away a coating placed on the gate structure without exposing the drain region or the source region.

17. The method of claim 10, further comprising heating the device after said removing to activate the second dopant in the source region and the drain region.

18. The method of claim 10, wherein said doping includes implanting the boron difluoride ions and the first dopant includes boron atoms.

19. A method, comprising:
   (a) forming a first layer on a semiconductor substrate, the first layer being in contact with the semiconductor substrate after said forming;
   (b) establishing a second layer in contact with the first layer;
   (c) doping the second layer with a first dopant species;
   (d) defining a gate member from said second layer after said doping, said defining including removal of a portion of said second layer;
   (e) implanting a second dopant species in the substrate and an upper region of the second layer to form a twice-doped part of the second layer after said defining; and
   (f) removing at least a portion of the twice-doped part of the second layer to substantially remove said first dopant species or said second dopant species from said gate member.

20. The method of claim 19, further comprising:
   (f) depositing a coating on the substrate before said removing; and
   (g) stripping said coating after said removing.

21. The method of claim 20, wherein said coating covers the second layer and said removing includes etching away the coating over the second layer and the twice-doped part of the second layer.

22. The method of claim 21, wherein the coating includes photoresist spun-on to form a generally flat surface before said selectively removing.

23. The method of claim 19, wherein the second dopant defines source and drain regions in the substrate and the first and second layers define an insulated gate structure.

24. The method of claim 23, wherein the source and drain regions and the insulated gate structure define an FET with a critical dimension of less than about 0.5 micron.

25. The method of claim 19, wherein the first dopant and the second dopant include boron atoms, and the second dopant is provided in the form of boron difluoride ions.

26. A method, comprising:
   (a) providing an integrated circuit, the circuit including a semiconductor substrate, an oxide layer on the substrate, and a polysilicon layer on the oxide layer, the polysilicon layer extending away from the substrate and being doped with elemental boron to increase electrical conductivity;
   (b) forming an insulated gate structure from the polysilicon layer and the oxide layer, said forming including partial removal of the polysilicon layer;
   (c) implanting boron difluoride ions in the substrate and a part of the polysilicon layer remaining after said forming; and
   (d) removing at least a portion of the polysilicon layer implanted with the boron difluoride ions by said implanting to substantially reduce the presence of fluorine in the polysilicon layer.

27. The method of claim 26, wherein said removing includes etching.

28. The method of claim 26, further comprising depositing a coating superjacent to the substrate before said removing and after said implanting.

29. The method of claim 26, further comprising heating the substrate to activate boron dopant atoms in the substrate.

30. The method of claim 26, wherein the insulated gate structure is positioned relative to a source and a drain to provide a field effect transistor, the source and the drain each corresponding to a region of the substrate doped by said implanting.

31. The method of claim 1, wherein said etching away does not remove a lower polysilicon portion of the gate structure doped with the first dopant.

32. The method of claim 10, wherein said removing only removes a portion of the polysilicon layer of the gate structure.

33. The method of claim 19, wherein said removing only removes a portion of the second layer comprising the gate member.

34. The method of claim 26, wherein said removing does not remove a lower part of the polysilicon layer.

* * * * *